US012699124B2

(12) United States Patent
Cook et al.

(10) Patent No.: US 12,699,124 B2
(45) Date of Patent: Aug. 4, 2026

(54) DETECTION AND LOCATION OF PARTIAL DISCHARGE AND ARC FAULTS

(71) Applicant: Qualitrol Company LLC, Fairport, NY (US)

(72) Inventors: Fraser Cook, Edinburgh (GB); Thomas Linn, Singapore (SG); Colin Brown, Glasgow (GB); Paul Donegan, Glasgow (GB)

(73) Assignee: Qualitrol Company LLC, Fairport, NY (US)

( * ) Notice: Subject to any disclaimer, the term of this patent is extended or adjusted under 35 U.S.C. 154(b) by 257 days.

(21) Appl. No.: 18/486,905

(22) Filed: Oct. 13, 2023

(65) Prior Publication Data

US 2024/0133936 A1 Apr. 25, 2024

Related U.S. Application Data

(60) Provisional application No. 63/416,748, filed on Oct. 17, 2022.

(51) Int. Cl.
*G01R 31/08* (2020.01)
(52) U.S. Cl.
CPC .................................... *G01R 31/08* (2013.01)

(58) Field of Classification Search
None
See application file for complete search history.

(56) References Cited

U.S. PATENT DOCUMENTS 5,859,590 A * 1/1999 Otani ................... H02H 1/0015
340/657

* cited by examiner

*Primary Examiner* — Farhana A Hoque
(74) *Attorney, Agent, or Firm* — Seed Intellectual Property Law Group LLP

(57) ABSTRACT

A system and method of automatically detecting electrical discharges in a gas insulated switchgear equipment and locating the electrical discharges in real-time is disclosed. The method includes sensing an ultra high frequency (UHF) signal generated from the electrical discharges at multiple channels simultaneously. The UHF signal sensed at multiple channels are reviewed simultaneously to determine whether they are of the same electrical discharge or not. The method also provides the sensed UHF signal at multiple channels to an artificial intelligence training model trained to determine the type of electrical discharge such as a partial discharge or an arc. The method provides a location of the electrical discharge based on an attenuation profile associated with the multiple channels and other information including amplitude information and distance information between adjacent channels.

20 Claims, 7 Drawing Sheets

*200*

*210*

DETECTION AND LOCATION OF PARTIAL DISCHARGE AND ARC FAULTS

BACKGROUND

Technical Field

The disclosure generally relates to systems and methods for detecting, separating and locating an electrical discharge such as a partial discharge (PD) and an "arc" caused by a flashover or breakdown within a Gas Insulated Switchgear (GIS).

Description of the Related Art

Current Partial Discharge Monitoring (PDM) systems are used to monitor the condition of Gas Insulated Switchgear (GIS) equipment and detect a partial discharge, which is a type of an electrical discharge, to address potential issues, such as insulation breakdown within the GIS, in early stages. A partial discharge, for example, is a micro spark causing a localized breakdown of the insulation within the GIS. An arc, on the other hand, is a full breakdown of the insulation within the GIS. The current PDM systems are limited in that in order to locate the partial discharge, a site visit is required to perform measurements with a fast oscilloscope and manually perform Time of Flight (ToF) calculations. None of the current PDM systems in the related art are able to detect arcs and automatically determine the location of a partial discharge or arc.

BRIEF SUMMARY

Various embodiments of the present disclosure address the various technical problems in the related art. One technical benefit of the systems and methods of the present disclosure is that it automatically locates the source of a partial discharge (PD) via an online continuous online monitoring system. As briefly mentioned above, current PDM systems in the related art identify the presence of PD. However, to locate the PD, an in-person site visit of a technician is required to perform measurements with a fast oscilloscope and manually perform ToF calculations. Accordingly, by allowing the customers to automatically identify and locate a PD via the online monitoring system, the process is made simpler and quicker. The proposed systems and methods can be easily incorporated into the existing equipment in the customer's existing workflow, and it allows better maintenance planning.

Another technical benefit of the systems and methods of the present disclosure is that it can also automatically locate arcs (or also interchangeably referred to as "arc faults"). This is important because an arc is a serious event which can result in the entire GIS being offline, which can lead to a utility leaving customers in the dark and compromising the customers' safety. Not only can fines be imposed, but the reputation of the utility company can also be tarnished, and obviously lost revenue will impact the company monetarily. By locating the arc (more specifically, locating the bay in which the arc occurred), the section with the arc can be isolated for repair and the other "healthy" bays can be immediately reenergized, thus restoring most of the functionality of the GIS and in most cases power to their customers.

Various embodiments of the present disclosure provide systems and methods which can detect and classify PD and arc faults within GIS. For example, embodiments detect an ultra-high frequency (UHF) signals that are generated by PD and arcs using UHF sensors. The UHF signal or UHF signals are detected, collected, processed, and analyzed for signal patterns. The information contained within the recorded PD patterns is used to determine if arcs or PD signals are active in the GIS, and to provide the location of the signal sources. Software techniques are used to classify, compare, and quantify the UHF signals generated by both PD signals and by arcs. The different software analyses used to carry out this task are described below in more detail. These analyses may be implemented using any suitable analysis technique such as artificial intelligence, machine learning, neural network, deep learning, and so on.

In an embodiment, a method includes sensing an electrical discharge that occurred at a discharge location using a plurality of sensors at respective sensing locations spaced apart from the discharge location. The electrical discharge, such as a partial discharge or an arc, generates an ultra-high frequency (UHF) signal. The method includes analyzing a signal pattern of the UHF signal sensed at respective sensing locations of the plurality of sensors. The method includes determining, based on the signal pattern, whether the UHF signal is a signal of the electrical discharge that occurred at the discharge location. In response to determining that the signal sensed at the respective sensing locations is a signal of the electrical discharge, the method determines the location of the electrical discharge based on an attenuation profile associated with the plurality of sensors.

In an embodiment, a system includes a plurality of sensors located at respective locations. Each sensor of the plurality of sensors is configured to sense at their respective sensing location an ultra-high frequency signal generated by an electrical discharge. The system includes a processing circuitry (e.g., one or more processors co-located or distributed across multiple devices) coupled to the plurality of sensors. In some embodiments, the processing circuitry is configured to obtain an attenuation profile between at least two sensors of the plurality of sensors. Here, the attenuation profile includes a known attenuation of signals travelling between the at least two sensors. The processing circuitry is further configured to determine a discharge location of the electrical discharge based on the attenuation profile.

In some embodiments, a system does not include the plurality of sensors located at respective locations as its element. However, the system is operatively coupled to the plurality of sensors such that the sensed information (e.g., UHF signals, UHF signal pulses, signal patterns that vary over time, amplitude of the UHF signal pulses, or the like) from the sensors is received by the system. Each sensor of the plurality of sensors is configured to sense at its respective sensing location an ultra high frequency signal generated by an electrical discharge. The system includes a processing circuitry (e.g., one or more processors co-located or distributed across multiple devices) coupled to the plurality of sensors.

In some embodiments, the processing circuitry is configured to analyze a signal pattern of the electrical discharge signal sensed at respective sensing locations of the at least two sensors to determine a type of electrical discharge.

In some embodiments, the processing circuitry is configured to obtain an attenuation profile between at least two sensors of the plurality of sensors. Here, the attenuation profile includes a known attenuation between the at least two sensors. The processing circuitry is further configured to determine a discharge location of the electrical discharge based on the attenuation profile.

In an embodiment, a method includes determining a relative amplitude of an electrical discharge signal generated from a discharge location. Here, the relative amplitude is determined based on an amplitude of the electrical discharge signal sensed at respective locations of at least two sensors of a plurality of sensors. The method includes determining an attenuation profile associated with the at least two sensors of the plurality of sensors. The method further includes estimating the discharge location based on the relative amplitude and the attenuation profile.

In an embodiment, a method of generating an attenuation profile includes providing a plurality of sensors including a first sensor at a first location and a second sensor at a second location. The first and second locations are different and spaced apart from each other. The method includes injecting an injection signal into an injection point along a signal transmission path where at least one sensor among the first and second sensors is located. Here, the first location is closer to the injection point than the second location. The method includes determining a first amplitude difference between the first sensor at the first location and the second sensor at the second location. The method further includes determining a first attenuation profile based on the first amplitude difference.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless the context indicates otherwise. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. Moreover, some elements known to those of skill in the art have not been illustrated in the drawings for ease of illustration. One or more embodiments are described hereinafter with reference to the accompanying drawings in which.

DETAILED DESCRIPTION

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to interfaces, physical component layout, etc., have not been shown or described in order to avoid unnecessarily obscuring descriptions of the embodiments. Additionally, the various embodiments may be methods, systems, or devices.

Throughout the specification, claims, and drawings, the following terms take the following meanings, unless the context indicates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context indicates otherwise. As used herein, the term "or" is an inclusive "or" operator and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context indicates otherwise. In addition, throughout the specification, the meaning of "a," "an," and "the" include singular and plural references.

Figure 1A:
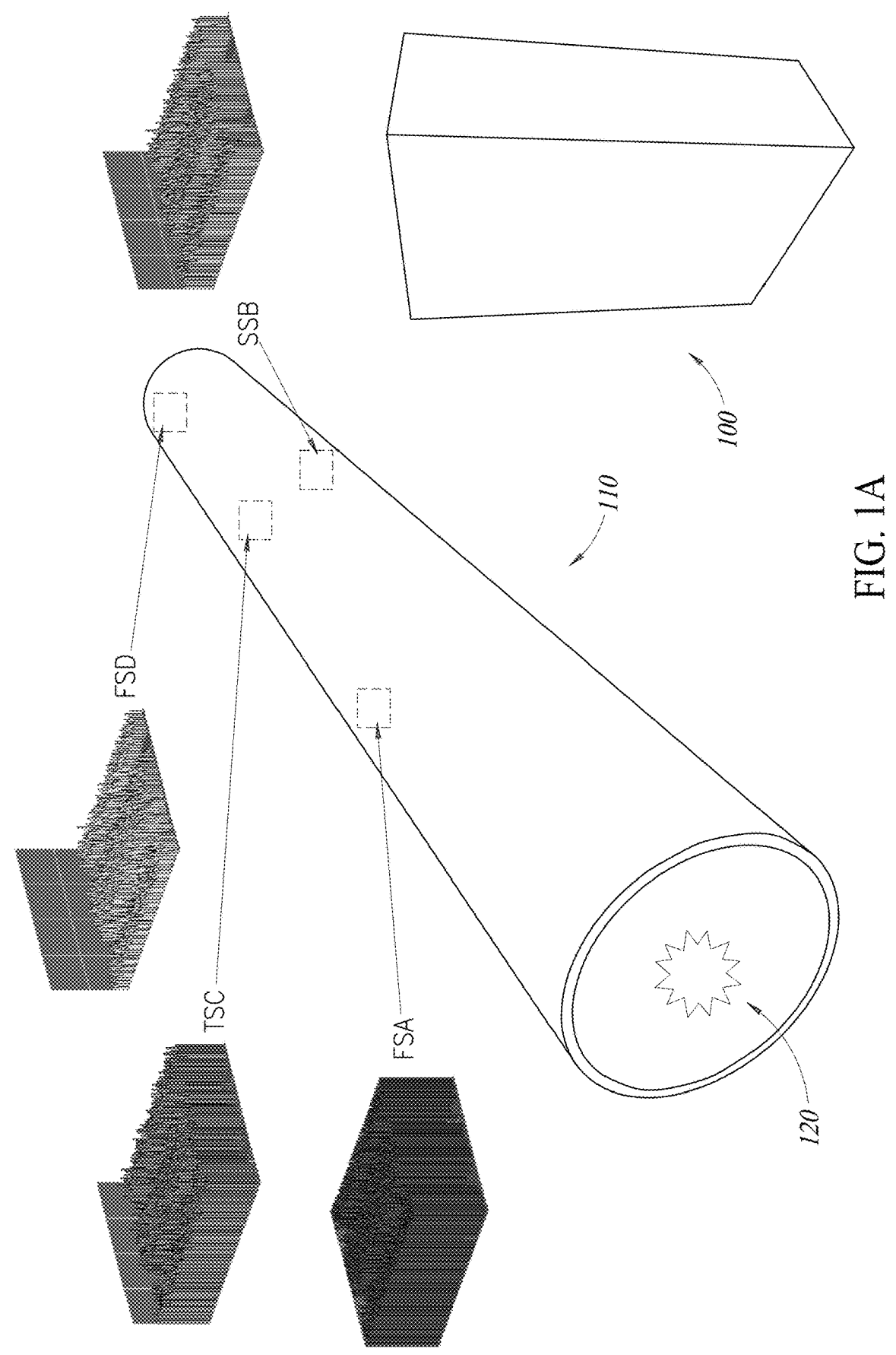
FIG. 1A is a view showing a Gas Insulated Switchgear (GIS) equipment operatively coupled to a monitoring system according to various embodiments of the present disclosure.

FIG. 1A is a view showing a generic model of Gas Insulated Switchgear (GIS) equipment coupled to a monitoring system according to various embodiments of the present disclosure.

Figure 5:
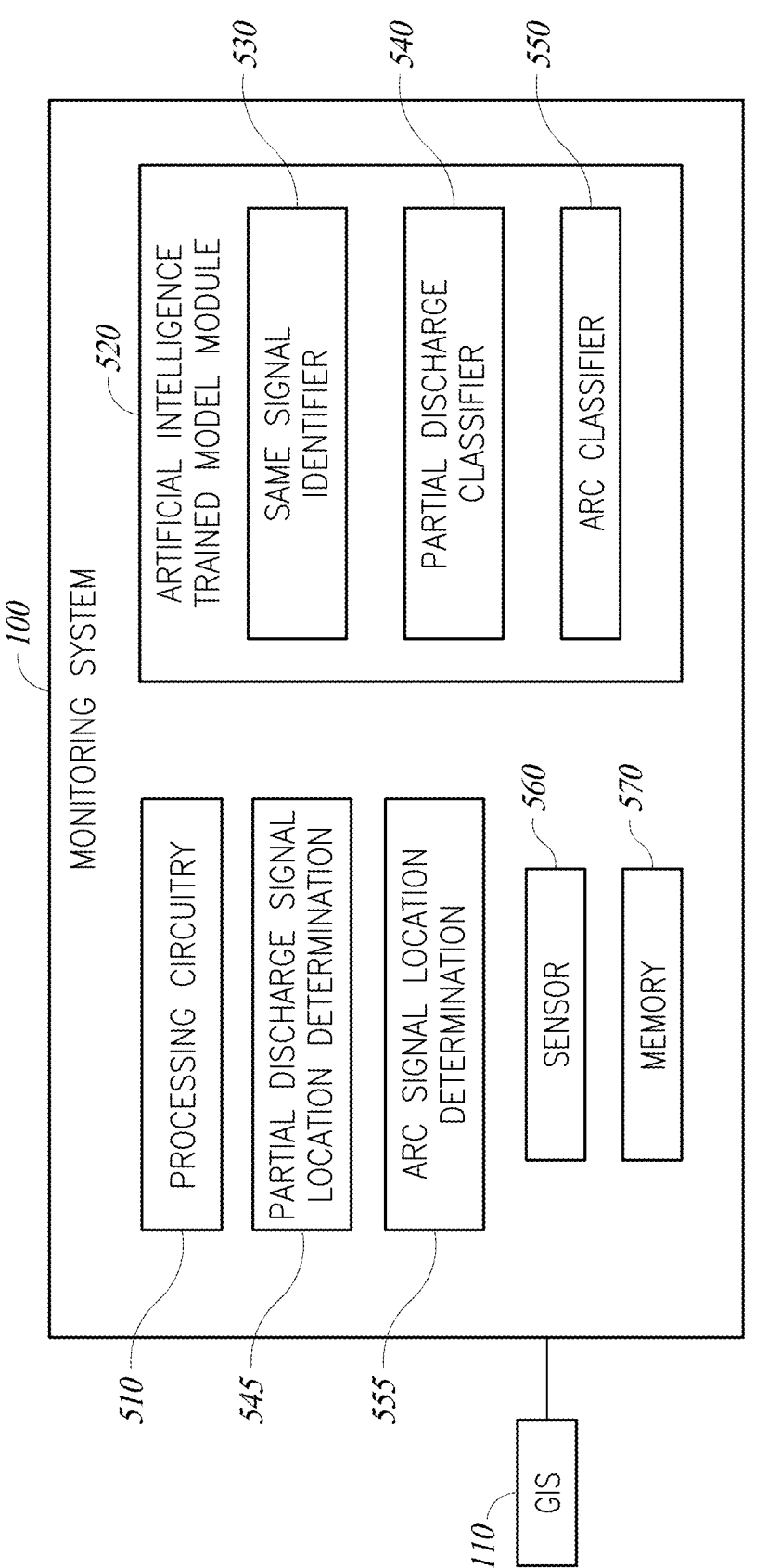
FIG. 5 is a block diagram of a monitoring system according to various embodiments of the present disclosure.

In FIG. 1A, a monitoring system 100 (hereinafter referred to as a "monitoring system"; the "monitoring system" also is shown in FIG. 5) is coupled to a GIS equipment 110 (or simply "GIS" or "GIS equipment") and the GIS is coupled to a plurality of sensors (e.g., a first sensor "A" (FSA), a second sensor "B" (SSB), a third sensor "C" (TSC), a fourth sensor "D" (FSD), etc.) for sensing an electrical discharge (or electrical discharge signal) 120 that is about to occur, or occurring, or occurred in the GIS 110.

The partial view of the GIS equipment 110 shown in FIG. 1A can be any GIS that is available in the related art. GIS is a type of high-voltage electrical equipment used in substations and power distribution systems (e.g., a type of electrical substation equipment used to control and distribute electrical power). It is designed to compactly house and isolate electrical components, such as circuit breakers, disconnectors, and busbars, within a sealed metal enclosure filled with a high dielectric gas such as sulfur hexafluoride ($SF_6$) gas, which is an effective insulation to prevent electrical discharges and maintain proper functioning. A partial discharge monitoring system (or PDM systems) in the related art are primarily used to monitor the condition of insulation within high-voltage equipment like GIS. The monitoring system according to the present disclosure also performs the various functionalities of the PDM systems in the related art. In order to distinguish PDM systems in the related art with the inventive system according to the present disclosure, the disclosure will refer to the inventive system as the monitoring system. The monitoring system will be described in further detail in connection with FIG. 5.

During operation, the monitoring system continuously monitors the insulation of the GIS for electrical discharges. One example of electrical discharges are partial discharges, which are small electrical discharges that can occur when insulation begins to break down. Unlike the PDM systems in the related art, the monitoring system can also detect and localize arcs which are also a type of electrical discharge. Detecting partial discharges early allows for maintenance or repairs before a major failure occurs. For example, detecting partial discharges provides an indication that insulation is degrading or that there may be other problems within the GIS equipment. As described earlier, early detection enables proactive maintenance and reduces the risk of catastrophic failures, which can be expensive and disruptive. Further, early detection of electrical discharges allows for timely intervention to mitigate risks (e.g., potential for fires or other hazardous situations). Moreover, GIS equipment is a significant investment for utilities and industries. The monitoring system can help extend the lifespan of the GIS equipment by automatically locating electrical discharges. This can result in cost savings over time and also can reduce the need for premature equipment replacement.

Now, referring to FIG. 1A, the first sensor FSA is located at a first location (or a first sensing location) within the GIS equipment 110. The second sensor SSB is located at a second location (or a second sensing location), the third sensor TSC is located at a third location (or a third sensing location), and the fourth sensor FSD is located at a fourth location (or a fourth sensing location) within the GIS. As shown, the first, second, third, and fourth locations are spaced apart and different from each other. The plurality of sensors is configured to sense ultra-high frequency (UHF) signals and any sensors in the related art suitable for performing such sensing function can be used (e.g., UHF sensors).

Electrical discharges 120 generate a UHF signal (or UHF signals). FIG. 1A shows an example of a signal pattern including signal pulses sensed at the first sensor FSA, the second sensor SSB, the third sensor TSC, and the fourth sensor FSD at a quasi-same moment in time. Differently put, each signal pattern shown in FIG. 1A is the signal pattern detected based on the UHF signal concurrently measured at four different sensing locations. The monitoring system analyzes the signals detected concurrently at different locations and determines whether the signals originated from the same source. According to FIG. 1A, these are four examples of the same electrical discharge. This process is beneficial in order to determine the location of the source (i.e., discharge location) and will be detailed in connection with FIGS. 2-4.

Referring back to FIG. 1A, the amplitude of the signal pulses (e.g., each line extending upward is a signal pulse of the UHF signal) in the signal pattern show that the amplitude attenuates as it gets farther from a discharge location or the origin of the electrical discharge 120. The amplitude of the signal pulses sensed at the first sensor FSA at the first location which is closest to the discharge location has the highest amplitude (to be specific, highest average amplitude) of the signal pulses among the four sensors at four different locations.

In at least one embodiment, the sensors are spaced apart at a distance such that a signal injected at or near one sensor (for example the first sensor FSA) can be sensed at the next sensor closest to the first sensor FSA.

A person of ordinary skill in the art readily appreciates that the monitoring system according to the present disclosure can be incorporated into existing Partial Discharge Monitoring (PDM) systems by way of a software and hardware update.

Figure 1B:
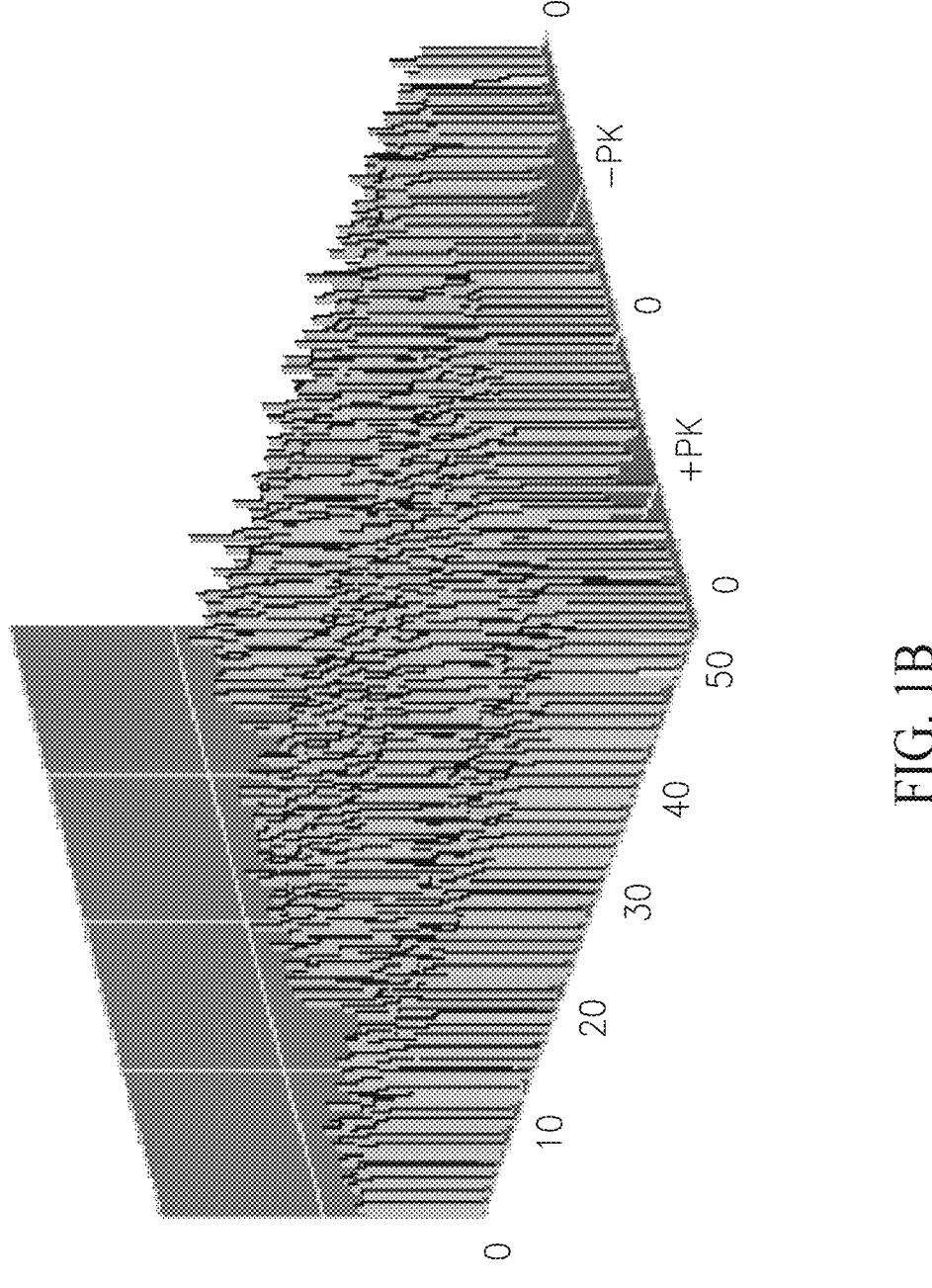
FIG. 1B is an enlarged view of an ultra-high frequency (UHF) signal pattern sensed at one of the sensors among the plurality of sensors shown in FIG. 1A.

FIG. 1B is an enlarged view of a signal pattern sensed at one of the sensors among the plurality of sensors shown in FIG. 1A.

FIG. 1B shows a signal pattern of a UHF signal sensed at the fourth sensor FSD in FIG. 1A. A signal pattern of a UHF signal may be generated or derived from the UHF signal in a variety of ways. In the signal pattern shown, each line extending upward represents a signal pulse. One method of generating the signal pattern is by mapping the position of the signal pulses of the UHF signal onto an AC cycle (or power frequency cycle). The signal pattern changes over time and the change of the signal pattern is studied over the power frequency cycle to determine the type of an electrical discharge indicated by the UHF signal (e.g., is it a partial discharge or an arc), and whether the signal pattern sensed at different sensor locations is from the same electrical discharge.

The type of electrical discharge can be determined by analyzing the signal patterns since the signal patterns vary differently as the AC cycle varies. That is, the signal patterns over time for a partial discharge, an arc, or the like, vary differently. An artificial intelligence model is trained to classify the signals according to the various types of electrical discharge.

A method of detecting and locating electrical discharges in a GIS will now be detailed in the following descriptions with reference to the drawings.

Figure 2:
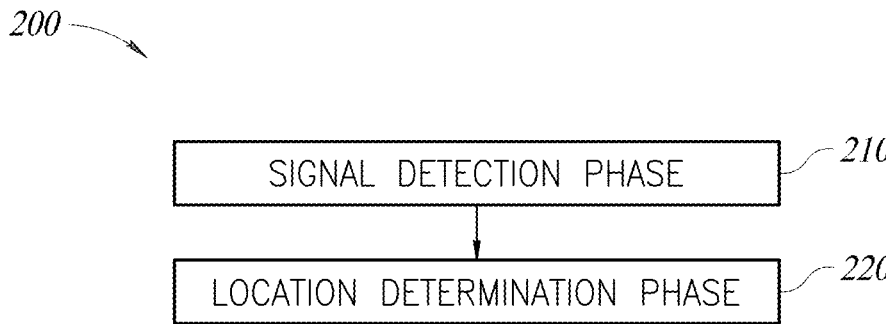
FIG. 2 is a flow chart of a process or method of detecting and locating an electrical discharge in a GIS equipment.

FIG. 2 is a flow chart of a process or method of detecting and locating an electrical discharge in a GIS equipment. The process 200 can be incorporated into the monitoring system. This process 200 can also be incorporated into an existing PDM system in the related art. The various process of detecting and locating an electrical discharge in a GIS equipment including process 200 can be performed by a processing circuitry 510 of the monitoring system 100. The processing circuitry 510 may include one or more processors (e.g., programmed microprocessors or application specific integrated circuits, for example) that co-located or distributed across multiple devices.

The process 200 involves two phases, a signal detection phase 210 and a location determination phase 220. The steps of the signal detection phase 210 and the location determination phase 220 can be performed by the various components of the monitoring system. The various components of the monitoring system will be explained in connection with FIG. 5.

The signal detection phase 210 involves detecting a signal (e.g., UHF signal) at multiple sensing locations using a plurality of sensors potentially originating from an electrical discharge and analyzing the signal pattern of the UHF signal (as shown in FIG. 1B) detected at each sensor location.

The location determination phase 220 involves determining whether the potential electrical discharge is an electrical discharge of interest (e.g., a partial discharge, arc, flashover, or the like) and also determining the discharge location of either the partial discharge or the arc based on various factors including, but not limited to, attenuation profiles associated with the plurality of sensors, distances between adjacent sensors of the plurality of sensors, amplitude information collected at respective sensing locations of the plurality of sensors, or the like.

There are various technical benefits of being able to automatically determine the location of a partial discharge or an arc through the inventive monitoring system.

For example, an arc or a flashover may not last very long as protection through a circuit breaker will activate and the GIS equipment will be switched off. After an arc has occurred it is possible that a significant portion of the GIS has been automatically switched out by the protection scheme.

The inventive monitoring system provides a technical solution of locating where the arc occurred. If the location of the arc is identified, the particular section or bay of the GIS equipment where the arc occurred can be located and remain switched out while other sections or bays of the GIS equipment can be reenergized.

For example, if there are twelve bays (e.g., bay #1, bay #2, . . . bay #12) in the GIS equipment 110 and if an arc occurred in bay #4, the inventive monitoring system can determine that the arc occurred in bay #4. The inventive monitoring system according to the present disclosure would allow the operator to resume the rest of the bays to operational except for bay #4. This enables at least portions of the GIS equipment to stay online and transmit power to the customers while the technicians repair the bay where the fault occurred (e.g., bay #4). By automatically locating the discharge location of that arc, the monitoring system can determine which bay(s) of the GIS equipment should be switched off or left on.

The details of how to detect and locate an electrical discharge 120 such as a partial discharge or an arc in a GIS equipment will be further explained in detail in connection with FIGS. 3, 4, and 5.

Figure 3:
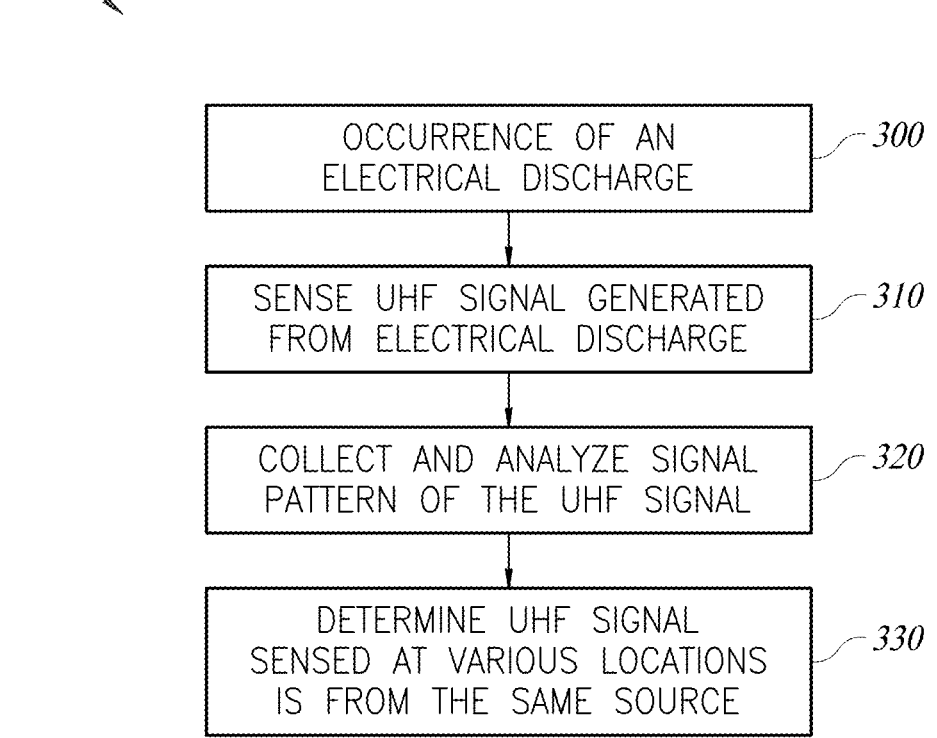
FIG. 3 is a flow chart of a signal detection phase according to various embodiments of the present disclosure.

FIG. 3 is a flow chart of a signal detection phase according to various embodiments of the present disclosure.

Referring to FIG. 3, in the signal detection phase 210, when a potential electrical discharge 120 occurs (at 300) at a discharge location, a UHF signal from the potential electrical discharge 120 is collected at various sensing locations within the GIS equipment.

If the UHF signal collected by a sensor represents noise and not an electrical discharge, the monitoring system according to the present disclosure continues to monitor for potential electrical discharges. On the other hand, if the UHF signal originated from an actual electrical discharge, the UHF signal generated from the electrical discharge 120 is sensed by the plurality of sensors at various locations (at 310). The monitoring system (or specifically, the processing circuitry 510 of the monitoring system) then analyzes the signal pattern of the UHF signal collected at various locations of the sensors (at 320).

For example, a partial discharge makes a signal in the UHF spectrum that can be detected. The signal pulses of the UHF signal are mapped onto the power frequency cycle to create a signal pattern as shown in FIG. 1B. By analyzing how the UHF signal pulses vary relative to time in certain frequencies, different signal patterns can be derived. By analyzing the different signal patterns, the monitoring system can determine that there is a defect and also can automatically determine what the defect is (e.g., type of defect such as arc, partial discharge, etc.).

The monitoring system then determines whether the signal sensed at various sensor locations originated from the same source based on analyzing the signal patterns (at 330) of the detected signals. That is, the monitoring system determines whether the UHF signal sensed at the sensors FSA, SSB, TSC, and FSD, for example, at various different locations originated from the same electrical discharge at the discharge location.

In some embodiments, the signal pattern is provided to an AI trained model, namely either an arc classifier model or a partial discharge classifier model. Using the trained models, the monitoring system determines (at 400 and at 410 of FIG. 4) whether the electrical discharge is an arc or a partial discharge. The monitoring system then determines whether the signal sensed at various locations are from the same arc (or partial discharge) based on analyzing the signal pattern of the UHF signal (at 330). That is, the monitoring system can determine that the UHF signal originated from the same source after determining the type of the electrical discharge and analyzing the signal patterns.

The process of determining the discharge location of the electrical discharge 120 will be detailed in connection with FIG. 4.

Figure 4:
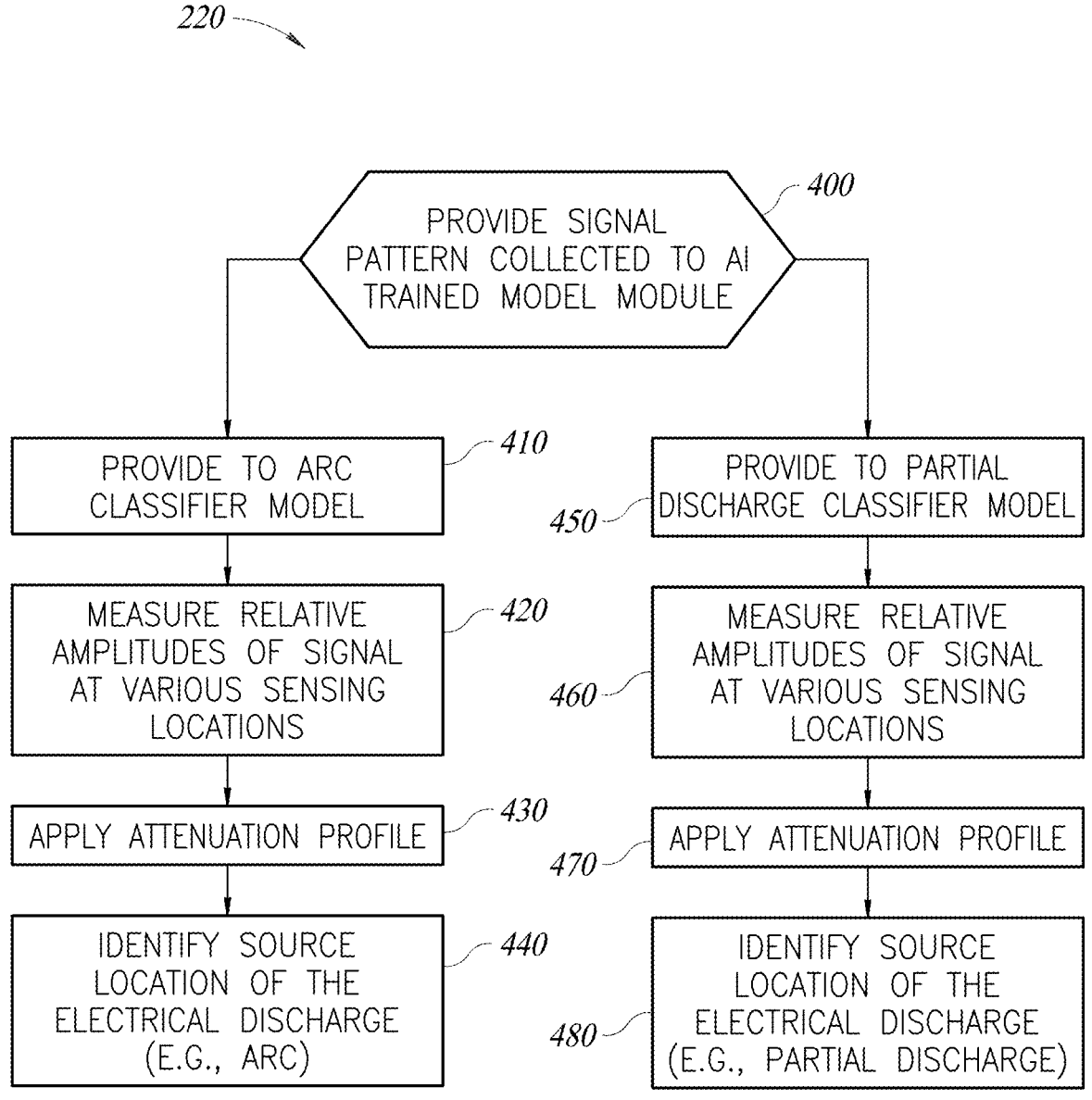
FIG. 4 is a flow chart of a location determination phase according to various embodiments of the present disclosure.

FIG. 4 is a flow chart of a location determination phase according to various embodiments of the present disclosure.

FIG. 5 is a block diagram of a monitoring system according to various embodiments of the present disclosure.

After determining that the sensed UHF signal is from the same source based on analyzing the signal pattern, the signal pattern from the plurality of sensors is provided to a trained artificial intelligence (AI) model module 520 (at 400).

As shown in FIG. 5, the trained AI model module 520 includes, among others, a same signal identifier 530, a partial discharge classifier 540, and an arc classifier 550.

In at least one embodiment, the monitoring system can simultaneously review the UHF signals collected from different locations (see signal patterns shown in FIG. 1A) and determine whether the UHF signals are from the same source (see FIG. 3 at 320 and 330). Namely, the monitoring system can determine whether the various signals detected by different sensors are of the same electrical discharge using a trained AI model, namely, the same signal identifier 530.

The same signal identifier 530 is a trained AI model that can identify that two or more channels (e.g., UHF sensors) have concurrently or simultaneously detected the same electrical discharge. Namely, the same signal identifier 530 compares two signal patterns with different amplitude and attenuation data and determines if the two patterns indicate that the detected UHF signal originated from the same signal source. This will then allow the relative amplitude of the two or more signals and an attenuation profile to be used to locate the signal source (i.e., the discharge location). FIG. 1A shows an example of the amplitude of each signal pulse of the signal patterns at four different sensors.

The arc classifier 550 is a trained AI model that can identify if signal patterns in a UHF signal contain a signal generated from arcing (from a fault condition). The arc classifier model 550 can automatically identify arc signals based on the signal pattern. The training database, includes exemplars generated from arcs. The arc classifier 550 was trained such that it can classify if a signal is an arc or not an arc. Here, the monitoring system can apply the signal patterns to the arc classifier 550 and use the arc classifier 550 to classify the type of signal (e.g., "arc" or "not arc").

In some embodiments, the arc classifier 550 classifies a type of the electrical discharge based on the signal pattern of the UHF signal. In one embodiment, classifying a type of the electrical discharge based on the signal pattern of the UHF signal includes determining a similarity between the signal pattern with signal patterns learned by an arc classifier model.

Similarly, the partial discharge classifier 540 is a trained AI model that can automatically classify a PD fault based on the signal pattern. The training database, may include different PD (and non-PD) sources active in "in-service" GIS by different GIS manufacturers and at different voltage classes. The partial discharge classifier 540 is trained such that it can classify the type of a PD signals based on its signal pattern. Here, the monitoring system of the system can apply the signal patterns to the partial discharge classifier 540 and use the partial discharge classifier 540 to classify the type of signal (e.g. void, free particle etc.).

In some embodiments, the partial discharge classifier 540 classifies a type of the electrical discharge based on the signal pattern of the UHF signal. In one embodiment, classifying a type of the electrical discharge based on the signal pattern of the UHF signal includes determining a similarity between the signal pattern with signal patterns learned by a partial discharge classifier model.

In some embodiments, the signal pattern of the UHF signal (at 320) can be provided to either the arc classifier model (at 410) or the partial discharge classifier model (at 450). If the AI model determines that the signal pattern is an arc or a partial discharge, then the same signal identifier 530 is executed to determine which sensors concurrently detect the same discharge signal.

Referring to FIG. 4, at 410, the signal patterns determined from UHF signals detected at various sensing locations using the sensors (see FIG. 1A) may be provided to the arc classifier 550 to determine whether the electrical discharge 120 is an arc.

Upon the arc classifier 550 determining that the electrical discharge 120 is an arc, the relative amplitudes of the signal measured at various sensing locations (see FIG. 1A) where the sensors are located are obtained (at 420).

The monitoring system then retrieves and applies an attenuation profile associated with each pair of UHF sensors (at 430). The attenuation profile is previously determined and retrieved by the monitoring system when needed. That is, the monitoring system can retrieve the attenuation profile associated with each pair of sensors and then use the retrieved attenuation profile to analyze the relative amplitude to determine the discharge location.

The monitoring system determines the discharge location of the arc based on the attenuation profile and the amplitude information (e.g., measured amplitudes of the signal sensed where the sensors are located) (at 440).

A specific method of determining the attenuation profile for each sensor of the plurality of sensors will be detailed further below.

At 450, the signal patterns obtained from UHF signals detected at various sensing locations using the UHF sensors may also be provided to the partial discharge classifier 540 to determine whether the UHF signal indicates the electrical discharge 120 is a partial discharge.

Upon the partial discharge classifier 540 determining that the electrical discharge 120 is a partial discharge, the relative amplitudes of the UHF signal measured at various sensing locations (see FIG. 1A) where the sensors are located are obtained (at 460).

The monitoring system then retrieves and applies an attenuation profile associated with each pair of sensors (at 470). The attenuation profile is previously determined and retrieved by the monitoring system when needed. That is, the monitoring system can retrieve the attenuation profile associated with the sensors and then use the retrieved attenuation profile to analyze the relative amplitude to determine the discharge location.

The monitoring system determines the location of the partial discharge based on the attenuation profile and the amplitude information (e.g., measured amplitudes of the signal sensed where the sensors are located) (at 480).

Referring to FIG. 5, the monitoring system 100 includes an artificial intelligence trained model module 520, a sensor 560, and a memory 570. The GIS equipment 110 is operatively coupled to the monitoring system.

The sensor 560 which includes the plurality of sensors shown in FIG. 1A is located within the GIS equipment 110.

As previously described, the artificial intelligence trained model module 520 includes the same signal identifier 530, the partial discharge classifier 540, and the arc classifier 550 and its functions and how it is trained have been described and are not repeated here.

A processing circuitry 510, a partial discharge signal location determination circuitry 545, or an arc signal location determination circuitry 555 may include any electrical circuitry, features, components, an assembly of electronic components or the like. That is, for example, any processor-based or microprocessor-based system including systems using microcontrollers, integrated circuit, chip, microchip, reduced instruction set computers (RISC), application specific integrated circuits (ASICs), field-programmable gate arrays (FPGAs), graphical processing units (GPUs), logic circuits, and any other circuit capable of executing the various operations and functions described herein may refer to as a processing circuitry of the monitoring system. Further, the above examples are examples only, and are not intended to limit in any way the definition or meaning of the term "processing circuitry." Further, the term processing circuitry does not necessarily mean that it is limited to a single processor. For example, one or more processors can be utilized to perform the various methods and processes described in the present disclosure. Further, the location of the one or more processors does not necessarily have to be within the housing of a system. As long as the one or more processors are communicatively coupled to each other, the physical location of where the one or more processors reside may be different from each other and some processors may be located outside of the housing of the system.

The monitoring system may include or otherwise be operatively coupled to a memory 570. The memory 570 may include Random Access Memory (RAM), Read Only Memory (ROM), an Electrically Erasable and Programmable ROM (EEPROM), a flash memory, or other memory technologies such as a Compact Disc (CD)-ROM, a Digital Video Disk (DVD), or other optical disk storage devices, solid state disk drive (e.g., flash RAM), or the like.

In some embodiments, the memory 570 may store information regarding a distance between each pair of sensors of the plurality of sensors. That is, the memory 570 may store information regarding a distance between the first sensor FSA and the second sensor SSB, a distance between the second sensor SSB and the third sensor TSC, and so forth. The distance between each pair of sensors of the plurality of sensors is known or can be easily obtained and stored.

The memory 570 may also store attenuation profiles associated with the plurality of sensors. That is, the memory 570 may store an attenuation profile reflecting signal attenuation of a transmission path between the first sensor FSA and the second sensor SSB, an attenuation profile reflecting signal attenuation between the second sensor SSB and the third sensor TSC, an attenuation profile reflecting signal attenuation between the first sensor FSA and the third sensor TSC, an attenuation profile reflecting signal attenuation between the first sensor FSA and the fourth sensor FSD, and so forth.

Additionally, the memory 570 may store amplitude information of the UHF signals. In particular, the amplitude information which includes the amplitude of the signal pulses in the signal pattern of the UHF signal as shown in FIG. 1A is stored in the memory 570 and the relative amplitude information between each pair of sensors of the plurality of sensors is also stored in the memory 570. The above listed examples of what information is stored in the memory 570 is not exhaustive and other information that the monitoring system requires to perform the function of locating the electrical discharge can be stored in the memory 570.

The monitoring system performs the function of locating a partial discharge through a partial discharge signal location determination circuitry 545 within the monitoring system, and the function of locating an arc through an arc signal location determination circuitry 555 within the monitoring system. In some embodiments, the partial discharge signal location determination circuitry 545 and the arc signal location determination circuitry 555 can be implemented by processing circuitry incorporated within the monitoring system. In other embodiments, the partial discharge signal location determination circuitry 545 and the arc signal location determination circuitry 555 may be implemented by processing circuitry that is operatively coupled to the monitoring system and does not have to be incorporated within the monitoring system.

In some embodiments, the monitoring system can be operatively coupled to the partial discharge signal location determination circuitry 545 and an arc signal location determination circuitry 555 and these circuitries does not necessarily have to be implemented within the monitoring system.

The partial discharge signal location determination circuitry 545 retrieves the attenuation profile associated with each sensor of the plurality of sensors 560 and uses the attenuation profile to analyze the signal amplitudes measured by the plurality of sensors to determine the discharge location of the electrical discharge. In some embodiments, the function of the partial discharge signal location determination circuitry 545 and the function of the processing circuitry 510 may overlap or perform the same function for efficiency purposes or any other circuit design purposes. Similarly, the arc signal location determination circuitry 555 retrieves the attenuation profile associated with each sensor of the plurality of sensors 560 and uses the attenuation profile to analyze the amplitude measured by the plurality of sensors to determine the discharge location of the electrical discharge. In some embodiments, the function of the arc signal location determination circuitry 555 and the function of the processing circuitry 510 may overlap or perform the same function for efficiency purposes or any other circuit design purposes.

In some embodiments, the partial discharge signal location determination circuitry 545 and the arc signal location determination circuitry 555 perform the process described in connection with FIGS. 3 and 4. This will be further explained later below.

In order to locate the electrical discharge, an attenuation profile for each pair of sensors is calculated and stored in advance in the memory 570. The method of obtaining an attenuation profile will be explained in connection with FIGS. 6A and 6B and the method of using the attenuation profile to analyze the amplitude information to identify the discharge location of the electrical discharge will be explained in connection with FIG. 7.

Figure 6A:
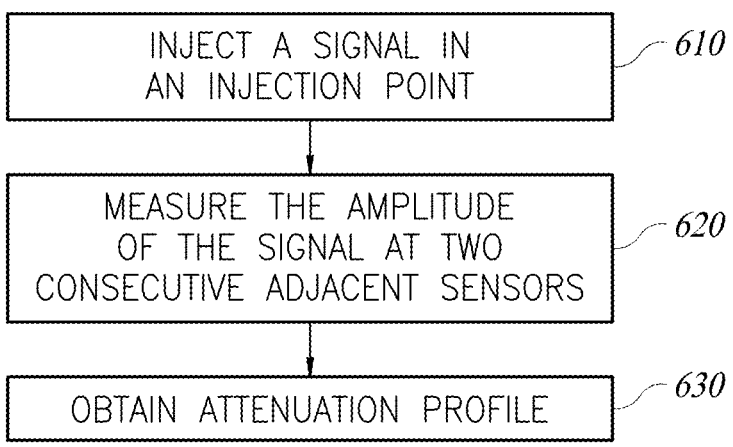
FIG. 6A is a flow chart of a method of obtaining an attenuation profile associated with a plurality of sensors placed in a GIS equipment according to various embodiments of the present disclosure.

FIG. 6A is a flow chart of a method of obtaining an attenuation profile associated with a plurality of sensors placed in a Gas Insulated Switchgear (GIS) equipment according to various embodiments of the present disclosure.

Figure 6B:
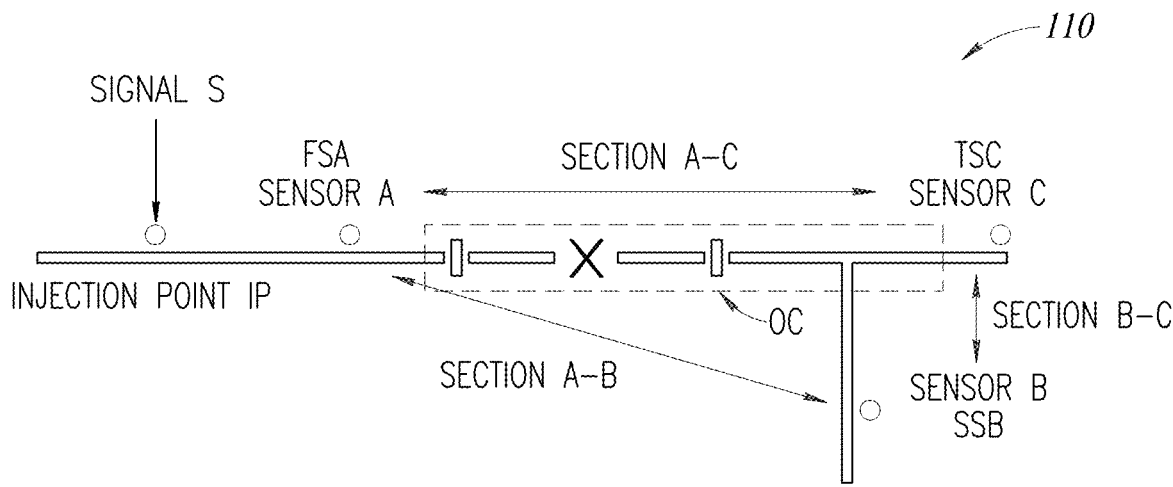
FIG. 6B is a simplified diagram showing the locations of the plurality of sensors within the GIS equipment.

FIG. 6B is a simplified diagram showing the locations of the plurality of sensors positions within the GIS equipment.

In general, generating an attenuation profile involves determining how a particular property or quantity changes (i.e., attenuates) as it moves through a material or along a specific path. That is, the attenuation profile involves information reflecting how something decreases or changes with distance or position. Here, the change in amplitude of a signal over a transmission path is measured in order to calculate an attenuation profile associated with each sensor of a plurality of sensors.

First, a signal S is injected at an injection point IP (at 610). FIG. 6B shows a first sensor FSA, a second sensor SSB, and a third sensor TSC of the plurality of sensors positioned within the pathway of the pipeline of the GIS equipment 110. The first sensor FSA is at a first location (or a first sensing location), the second sensor SSB is located at a second location (or a second sensing location), and a third sensor TSC is located at a third location (or a third sensing location). As shown, the first, second, and third locations are spaced apart from each other. In this particular example, the third sensor TSC is located the farthest from the injection point IP and the second sensor SSB is located between the first sensor FSA and the third sensor TSC. Further, the various high voltage components along the pathway of the GIS equipment 110 can be located in an area labeled as OC in FIG. 6B. However, to simplify, the various high voltage components along the pathway of the GIS equipment 110 is not shown in FIG. 6B.

At 610, for instance, an injection unit is used to inject a fast rise time UHF pulse into the transmission path at injection point IP. Here, the signal S is injected into the transmission path at a location adjacent to the first sensor FSA.

The amplitude of the signal sensed at the first sensor FSA and the amplitude of the signal sensed at the second sensor SSB can be measured. Here, the amplitude difference between the first sensor FSA and the second sensor SSB is indicative of the attenuation for the A-B section of the transmission path between the first sensor FSA and the second sensor SSB.

At 620, the amplitude of the injected signal at two consecutive adjacent sensors is measured. For instance, the amplitude of the signal is measured at the first and second sensors that are adjacent to each other and an attenuation between these two adjacent sensors is calculated. In particular, to calculate the attenuation at each measurement point (e.g., where the sensors are located), an initial amplitude of the signal at a reference point (e.g., at the first location where the first sensor FSA is located) is measured and an amplitude of the signal at the measurement point (e.g., at the second location where the second sensor SSB is located) is measured.

Accordingly, the attenuation for the A-B section of the transmission path can be calculated by measuring the initial amplitude of the signal at the reference point (e.g., at the first location where the first sensor FSA is located) and the amplitude of the signal at the measurement point (e.g., at the second location where the second sensor SSB is located).

Once the attenuation for the A-B section is obtained, the attenuation between every pair of sensors in the GIS equipment 110 may be obtained. For instance, FIG. 6B illustrates three sensors in the GIS equipment 110. After the attenuation for A-B section is obtained, the attenuation for the A-C section and the B-C section can also be obtained.

An attenuation profile for each sensor pair of the plurality of sensors in the GIS equipment 110 can be obtained (at 630) and stored in a memory.

Once all of the attenuations associated with the plurality of sensors are measured, then the attenuation profile associated with each sensor of the plurality of sensors can be generated and stored.

In general, due to these HV components within the GIS, an attenuation of a signal transmission path within the GIS is not linear from one sensor to another sensor. For instance, there may be various HV components within the GIS between the first sensor FSA and the second sensor SSB as shown in FIG. 1A or FIG. 6B. The presence of these HV components affect the attenuation between the first sensor FSA and the second sensor SSB. In practice, there may be HV components in the A-B section, the A-C section, and/or the B-C section. Other components of the GIS including HV components can be located within the portion labeled OC in FIG. 6B.

These factors are relevant since different HV components have different attenuation characteristics. That is, circuit breaker, disconnector, busbar, bend, barrier insulator, or the like, may all attenuate a signal differently. Further, attenuation can have a directionality. For example, the attenuation of a signal transmitted from the first sensor FSA to the second sensor SSB and the attenuation of a signal transmitted from the second sensor SSB to the first sensor FSA may be different from each other. As such, all of these factors are considered in measuring signal attenuation between sensors and generating the attenuation profile for each sensor, with several assumptions.

The attenuation profile represents a model that is a simplification of complex UHF transmission characteristics. The simplification imposes a limitation on the accuracy that is achievable. However, the inventors of the present disclosure have experimented and appreciated that these assumptions sufficiently accurately enable determination of a discharge location of an electrical discharge (e.g., partial discharge, arc discharge).

Figure 7:
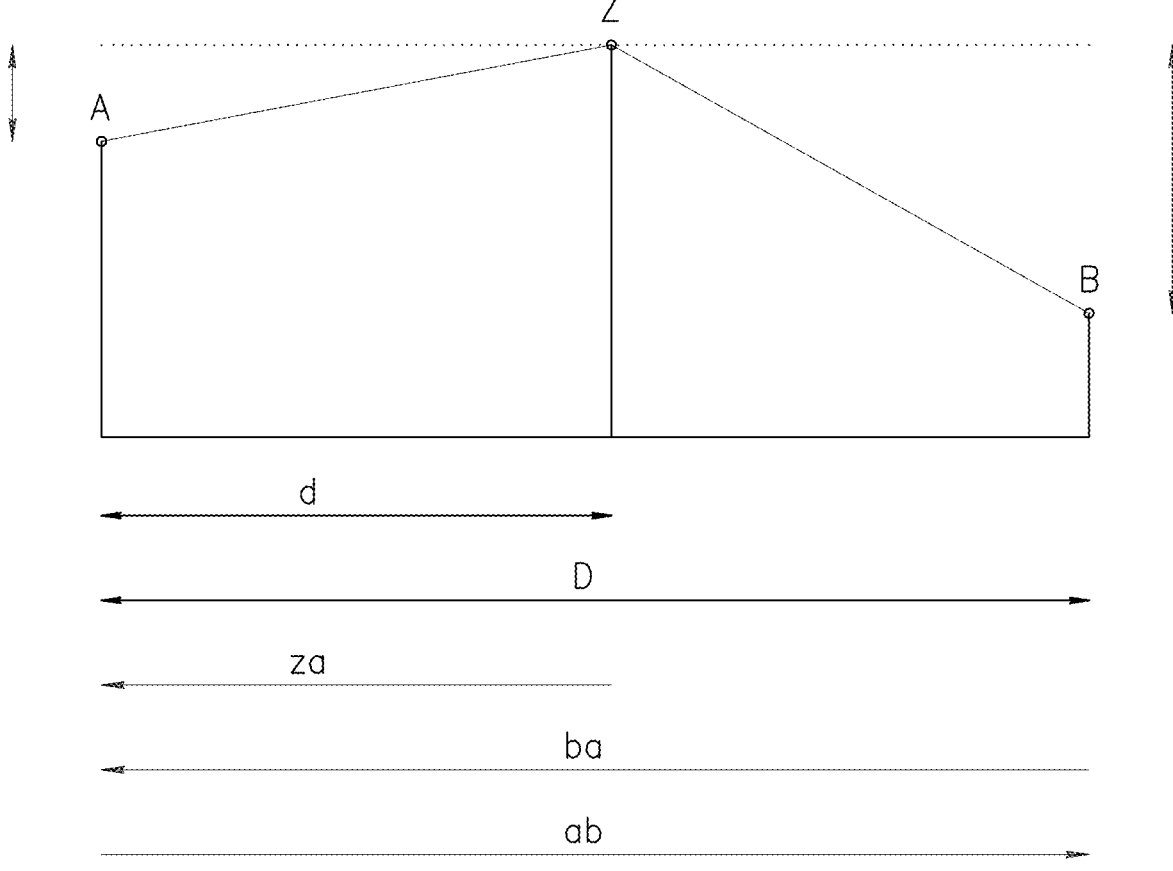
FIG. 7 illustrates a method of using an attenuation profile associated with a plurality of sensors placed in a GIS equipment to locate a discharge location of an electrical discharge.

FIG. 7 illustrates a method of using an attenuation profile associated with a sensor in a plurality of sensors placed in a Gas Insulated Switchgear (GIS) to locate a discharge location of an electrical discharge.

The attenuation algorithm assumes that attenuation is directional (e.g., can be different in either direction of signal travel). Referring to FIG. 7, Z indicates an actual amplitude of a signal (e.g., an electrical discharge) at an origin (i.e., discharge location). The actual amplitude Z of the electrical discharge is unknown. A indicates an amplitude of the signal at sensor A (e.g., the first sensor FSA). The amplitude of the signal where the first sensor A is located is known since this value can be measured by the sensor A. B indicates an amplitude of the signal at sensor B (e.g., the second sensor SSB). The amplitude of the signal where the second sensor B is located is known since this value can be measured by the sensor B. The term ab indicates a total attenuation between sensor A and sensor B and the term ba indicates a total attenuation between sensor B and sensor A. The value of the total attenuation ab and ba are not necessarily identical as attenuation has directionality. D indicates a total distance between sensor A and sensor B and the distance value is also known. Finally, the term d indicates a distance between the signal source at Z and the sensor A. Namely, this is the distance between the discharge location and the location of the sensor A (e.g., the first sensing location where the first sensor FSA is located).

Here, the amplitude of the signal at sensor A is related to the amplitude Z based on the following formula (1):

$$A = Z - \left( \frac{d}{D} \cdot ba \right)$$

Similarly, the amplitude of the signal at sensor B is related to the amplitude Z based on the following formula (2):

$$B = Z - \left( \left( \frac{D-d}{D} \right) \cdot ab \right)$$

The actual amplitude Z of the signal at the discharge location is unknown. However, formula (1) and formula (2) can be combined and expressed as follows, formula (3):

$$A + \left( \frac{d}{D} \cdot ba \right) = B + \left( \left( \frac{D-d}{D} \right) \cdot ab \right)$$

By solving formula (3) for the term d, the distance d between the discharge location and the sensor A can be expressed as follows, formula (4):

$$d = \frac{D(ab + B - A)}{ab + ba}$$

As discussed previously, value A, B, and D are known. Values ab and ba were previously obtained and stored when the attenuation profiles for sensor A and for sensor B were generated.

Accordingly, the distance between the discharge location and the sensor A can be determined.

It is reasonable to assume that the ratio of the 'attenuation from the discharge location to sensor' to 'total attenuation' is same as the ratio of the 'distance from the discharge location to sensor' to 'total distance.'

This assumption can be expressed as follows, formula (5):

$$\frac{d}{D} = \frac{za}{ba}$$

Therefore, by solving formula (5) and formula (4), the attenuation za can be expressed as follows:

$$za = \frac{ba(ab + B - A)}{ab + ba}$$

Once the attenuation of the signal from the discharge location to sensor A, namely za, is calculated, it is a case of iterating through each component from sensor A to sensor B, and sum the attenuation of each component, until the total attenuation of each component between sensor A and sensor B is greater than za. Once that calculation process is complete, the component of the GIS that contains the fault (e.g., electrical discharge) can been located.

The distance to the individual component that contains the fault may be calculated using formula (6) as follows:

distance to fault=total length of component×(attenuation from source to start of component÷total Attenuation of component)

In some embodiments, the same signal identifier 530 is provided with various signal patterns, and trained to classify whether the UHF signal is from the same source.

The same signal identifier 530 as well as the other classifiers (e.g., partial discharge classifier 540 and arc classifier 550) are trained using various different signal patterns.

The monitoring system utilizes various sensors to detect a signal and also determines if a signal is active simultaneously on multiple channels. Then the signal pattern of the signal is analyzed to determine if the sensed signals that are simultaneously active on multiple channels are of the same signal.

As noted above, the UHF signal sensed using UHF sensors at different locations includes different signal patterns with different amplitudes. This is due to the attenuation along various components within the GIS equipment. The process of determining whether the signal sensed at sensors are of the same signal source is achieved using the trained same signal identifier 530.

The monitoring system reviews the signal detected simultaneously at different locations and determines whether the signals are from the same source. These signal patterns are identified as origination from the same source. After this determination, the monitoring system determines the discharge location of the arc or partial discharge.

Further embodiments of the present disclosure include a method of generating an attenuation profile. The method includes: providing a plurality of sensors including a first sensor at a first location, and additional adjacent sensors at adjacent locations. Injecting an injection signal at an injection point along a transmission path where the first location being closer to the injection point than subsequent adjacent locations; determining a first amplitude difference between the first sensor at the first location and adjacent sensors; and determining an attenuation profile based on the amplitude differences.

In some embodiments, determining a first amplitude difference between the first sensor at the first location and the second sensor at the second location includes: measuring a first amplitude of the injection signal at the first sensor; measuring a second amplitude of the injection signal at the second sensor; and determining the first amplitude difference based on the first and second amplitudes.

Further embodiments of the present disclosure include a method of determining a location of an electrical discharge. The method includes: determining a relative amplitude of an electrical discharge signal generated at a discharge location, the relative amplitude being determined based on an amplitude of the electrical discharge signal sensed at respective locations of at least two sensors of a plurality of sensors; obtaining an attenuation profile associated with the at least two sensors of the plurality of sensors; and estimating the discharge location based on the relative amplitude and the attenuation profile.

In some embodiments, determining the attenuation profile between the at least two sensors of the plurality of sensors includes: determining an attenuation between adjacent sensors of the at least two sensors of the plurality of sensors.

In some embodiments, estimating the discharge location based on the relative amplitude and the attenuation profile includes: determining an attenuation from the discharge location to the at least two sensors of the plurality of sensors; summing an attenuation of components present between the at least two sensors; comparing the contribution of the attenuation of the components with the attenuation from the discharge location to the at least two sensors; and estimating the discharge location based on the comparison.

Further embodiments of the present disclosure include a method. The method includes determining a relative amplitude of an electrical discharge signal generated from a discharge location. The relative amplitude is determined based on an amplitude of the electrical discharge signal sensed at respective locations of at least two sensors of a plurality of sensors. The method includes determining an attenuation profile associated with the at least two sensors of the plurality of sensors. The method includes estimating the discharge location based on the relative amplitude and the attenuation profile.

In some embodiments, the method includes determining the attenuation profile between the at least two sensors of the plurality of sensors includes: determining an attenuation between adjacent sensors of the at least two sensors of the plurality of sensors.

In some embodiments, the method includes analyzing a signal pattern of the electrical discharge signal sensed at respective sensing locations of the at least two sensors to determine a type of electrical discharge.

Embodiments of the present disclosure may facilitate providing significant improvements in automatic real-time monitoring, maintenance, costs, and reduced delay.

Some embodiments may take the form of or comprise computer program products. For example, according to an embodiment of the present disclosure, there is provided a computer readable medium comprising a computer program with instructions adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., and various combinations thereof.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   sensing an electrical discharge that occurred at a discharge location using a plurality of sensors at respective sensing locations spaced apart from the discharge location, the electrical discharge generating an ultra high frequency (UHF) signal;
   analyzing a signal pattern of the UHF signal sensed at respective sensing locations of the plurality of sensors;

based on the signal pattern, determining whether the UHF signal is a signal generated from the electrical discharge;

in response to determining that the signal sensed at the respective sensing locations is a signal of the electrical discharge, determining the discharge location of the electrical discharge based on an attenuation profile associated with the plurality of sensors.

2. The method of claim 1, wherein determining the discharge location of the electrical discharge based on an attenuation profile associated with the plurality of sensors, includes:

obtaining, from the attenuation profile, one or more attenuations between adjacent sensors of the plurality of sensors that sensed the UHF signal;

obtaining one or more distances between the adjacent sensors of the plurality of sensors; and determining the discharge location of the electrical discharge based on the one or more attenuations and the one or more distances.

3. The method of claim 1, wherein determining the discharge location of the electrical discharge is further based on a signal amplitude of the UHF signal at the adjacent sensors.

4. The method of claim 1, wherein analyzing a signal pattern of the UHF signal includes:

mapping a position of pulses of the UHF signal over a power frequency cycle to create the signal pattern; and analyzing a change of the signal pattern during the power frequency cycle.

5. The method of claim 4, wherein the plurality of sensors includes a first sensor at a first sensing location and a second sensor at a second sensing location, and wherein the first and second sensing locations are different from each other, and the discharge location is between the first and second sensing locations.

6. The method of claim 5, wherein obtaining one or more attenuations between adjacent sensors of the plurality of sensors that sensed the UHF signal includes:

obtaining a first total attenuation from the first sensor to the second sensor;

obtaining a second total attenuation from the second sensor to the first sensor;

obtaining a first amplitude of the UHF signal sensed at the first sensor; and obtaining a second amplitude of the UHF signal sensed at the second sensor.

7. The method of claim 6, wherein obtaining one or more distances between the adjacent sensors of the plurality of sensors includes:

obtaining a total distance between the first sensor and the second sensor.

8. The method of claim 7, wherein determining the discharge location of the electrical discharge based on the one or more attenuations and the one or more distances includes:

adding the first total attenuation and the second amplitude to produce a first value;

subtracting the first amplitude from the first value to produce a second value; and multiplying the total distance by the second value to produce a third value.

9. The method of claim 8, wherein determining the discharge location of the electrical discharge based on the one or more attenuations and the one or more distances includes:

adding the first total attenuation and the second total attenuation to produce a fourth value; and dividing the third value with the fourth value to produce a fifth value, wherein the fifth value is indicative of a distance between the discharge location and the first sensor.

10. The method of claim 9, wherein determining the discharge location of the electrical discharge based on the one or more attenuations and the one or more distances includes:

multiplying the second total attenuation and the third value to produce a sixth value; and dividing the sixth value with the fourth value to produce a seventh value, wherein the seventh value is indicative of an attenuation between the discharge location and the first sensor.

11. The method of claim 1, comprising:

classifying a type of the electrical discharge based on the signal pattern of the UHF signal.

12. The method of claim 11, wherein classifying a type of the electrical discharge based on the signal pattern of the UHF signal includes:

determining that the type of the electrical discharge is either a partial discharge or an arc.

13. The method of claim 11, wherein classifying a type of the electrical discharge based on the signal pattern of the UHF signal includes:

determining a similarity between the signal pattern with signal patterns learned by a partial discharge classifier model.

14. The method of claim 11, wherein classifying a type of the electrical discharge based on the signal pattern of the UHF signal includes:

determining a similarity between the signal pattern with signal patterns learned by an arc classifier model.

15. A system, comprising:

a plurality of sensors located at respective locations, each sensor of the plurality of sensors configured to sense at their respective sensing location an ultra high frequency (UHF) signal generated by an electrical discharge;

a processing circuitry coupled to the plurality of sensors, the processing circuitry configured to:

analyze a signal pattern of the UHF signal sensed at respective sensing locations of the plurality of sensors;

based on the signal pattern, determine whether the UHF signal is a signal generated by the electrical discharge;

in response to determining that the UHF signal is a signal generated by the electrical discharge, utilize an attenuation profile between at least two sensors of the plurality of sensors, the attenuation profile including an attenuation between the at least two sensors; and determine a discharge location of the electrical discharge based on the attenuation profile, wherein the at least two sensors of the plurality of sensors include a first sensor and a second sensor.

16. The system of claim 15, wherein the processing circuitry is configured to analyze the signal patterns of the UHF signal sensed at the respective sensing locations of the at least two sensors to determine a type of electrical discharge.

17. The system of claim 15, wherein the processing circuitry is configured to obtain the attenuation profile between the at least two sensors of the plurality of sensors by:

determining a first attenuation profile between the first sensor and the second sensor, the first sensor being spaced apart from the second sensor at a first distance.

18. A method, comprising:

sensing an electrical discharge signal generated from a discharge location using at least two sensors of a plurality of sensors at respective locations;

analyzing a signal pattern of the electrical discharge signal sensed at the respective locations of the at least two sensors of the plurality of sensors;

based on the signal pattern, determining whether the electrical discharge signal is generated from the discharge location; and in response to determining that the electrical discharge signal is generated from the discharge location, determining a relative amplitude of the electrical discharge signal generated from the discharge location, the relative amplitude being determined based on an amplitude of the electrical discharge signal sensed at the respective locations of the at least two sensors of a plurality of sensors;

determining an attenuation profile associated with the at least two sensors of the plurality of sensors; and estimating the discharge location based on the relative amplitude and the attenuation profile.

19. The method of claim 18, wherein determining the attenuation profile between the at least two sensors of the plurality of sensors includes:

determining an attenuation between adjacent sensors of the at least two sensors of the plurality of sensors.

20. The method of claim 18, further comprising:

analyzing the signal pattern of the electrical discharge signal sensed at the respective locations of the at least two sensors to determine a type of electrical discharge.

* * * * *